US010224090B2

(12) United States Patent
Bains

(10) Patent No.: US 10,224,090 B2
(45) Date of Patent: Mar. 5, 2019

(54) DIRECTED PER BANK REFRESH COMMAND

(71) Applicant: Intel Corporation, Santa Clara, CA (US)

(72) Inventor: Kuljit S. Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/611,455

(22) Filed: Jun. 1, 2017

(65) Prior Publication Data

US 2018/0025771 A1 Jan. 25, 2018

Related U.S. Application Data

(63) Continuation of application No. 14/793,569, filed on Jul. 7, 2015, now Pat. No. 9,691,468, which is a continuation of application No. 14/039,768, filed on Sep. 27, 2013, now Pat. No. 9,117,542.

(51) Int. Cl.
*G11C 7/00* (2006.01)
*G11C 11/406* (2006.01)

(52) U.S. Cl.
CPC ...... *G11C 11/40615* (2013.01); *G11C 11/406* (2013.01); *G11C 11/40611* (2013.01); *G11C 11/40618* (2013.01)

(58) Field of Classification Search
CPC .............. G11C 11/406; G11C 11/4076; G11C 2211/4061; G11C 7/22; G11C 11/005; G11C 11/4097; G11C 11/413; G11C 2207/002; G11C 2207/2227; G11C 2207/2245; G11C 7/10; G11C 7/1018

USPC ...... 365/222, 230.03, 189.05, 189.2, 230.01, 365/230.08, 230.02, 230.06, 189.011, 365/189.04, 201, 233.1, 233.18
See application file for complete search history.

(56) References Cited

U.S. PATENT DOCUMENTS

| | | | |
|---|---|---|---|
| 7,221,609 | B1 | 5/2007 | Bains |
| 7,349,233 | B2 | 3/2008 | Bains et al. |
| 7,454,586 | B2 | 11/2008 | Shi et al. |
| 7,872,892 | B2 | 2/2011 | MacWilliams et al. |
| 8,064,237 | B2 | 11/2011 | MacWilliams et al. |
| 8,161,356 | B2 | 4/2012 | Bains et al. |
| 8,310,854 | B2 | 11/2012 | MacWilliams et al. |
| 8,484,410 | B2 | 7/2013 | Bains et al. |

(Continued)

OTHER PUBLICATIONS

Micron, "Mobile LPDDR SDRAM" 2010 Micron Technology, Inc., pp. 1-146.

*Primary Examiner* — Thong Q Le
(74) *Attorney, Agent, or Firm* — Compass IP Law PC

(57) ABSTRACT

A memory device includes a per bank refresh counter applicable to multiple banks in a group. The memory device increments a row address counter only when the per bank refresh counter is reset. The memory device receives a per bank refresh command from an associated memory controller, and performs a per bank refresh in response to receiving the per bank refresh command. The memory device refreshes a row identified by a row address counter for a bank identified by the per bank refresh command. The memory device increments the per bank refresh counter in response to receiving the per bank refresh command, and increments the row address counter when the per bank refresh counter is reset, either by rolling over or by a reset condition.

14 Claims, 5 Drawing Sheets

(56) References Cited

U.S. PATENT DOCUMENTS

| | | |
|---|---|---|
| 2006/0143372 A1 | 6/2006 | Walker et al. |
| 2006/0215474 A1* | 9/2006 | Hokenmaier ......... G11C 11/406 365/222 |
| 2007/0150667 A1 | 6/2007 | Bains et al. |
| 2014/0089576 A1 | 3/2014 | Bains et al. |
| 2014/0192605 A1 | 7/2014 | Crawford et al. |

\* cited by examiner

DIRECTED PER BANK REFRESH COMMAND

RELATED CASES

This application is a continuation of and claims the benefit of U.S. patent application Ser. No. 14/793,569, titled "DIRECTED PER BANK REFRESH COMMAND", filed Jul. 7, 2015, which further claims priority to U.S. patent application Ser. No. 14/039,768, titled "DIRECTED PER BANK REFRESH COMMAND", filed Sep. 27, 2013, now U.S. Pat. No. 9,117,542 both of which are hereby incorporated by reference in their entirety.

FIELD

Embodiments of the invention are generally related to memory device refresh, and more particularly to a directed per bank refresh command.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2013, Intel Corporation, All Rights Reserved.

BACKGROUND

Memory devices find ubiquitous use in electronic devices. Many electronic devices employ volatile memory devices, which provides relatively large amount of storage space for a low cost, and provides faster access to data compared to typical nonvolatile memory options. However, the volatile nature of volatile memory requires refreshing the memory devices to retain the data. Refreshing memory devices continues to take a large percentage of overall memory bandwidth. For example, with an 8 Gb LPDDR3 (low power dual data rate, version 3) DRAM (dynamic random access memory) die can take up approximately 5.38% of overall bandwidth as a refresh command has to be sent every 3.9 us (tREFI, refresh interval time) and each refresh command takes 210 ns (tRFC, time between refresh commands) to complete (210 ns/3.9 us=5.38%). The tRFC on a 16 Gb device tRFC value is expected to almost double, which would indicate that future memory devices are at risk of using up more (e.g., up to approximately 10%) total bandwidth in refresh. The more bandwidth a memory device uses in refresh, the less it has for processing data access commands (read or write), which can degrade memory subsystem performance.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
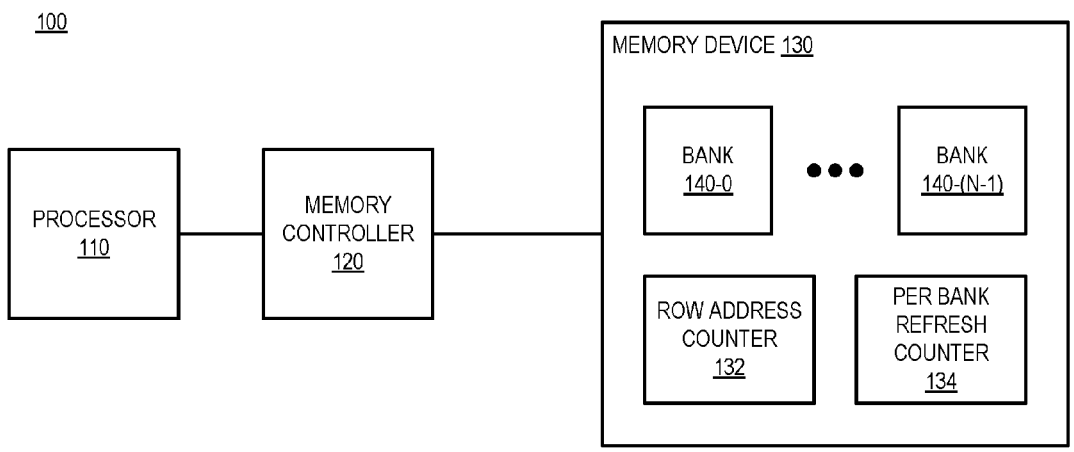
FIG. 1 is a block diagram of an embodiment of a system with a memory device that supports a per bank refresh.

Descriptions of certain details and implementations follow, including a description of the figures, which may depict some or all of the embodiments described below, as well as discussing other potential embodiments or implementations of the inventive concepts presented herein.

DETAILED DESCRIPTION

As described, a memory device includes a per bank refresh counter applicable to multiple banks in a group. A memory controller can issue per bank refresh commands with flexibility in ordering of the commands. Thus, the memory controller can appear to hide at least some refresh operations in the background.

The per bank refresh counter can enable the memory device to operate within the flexibility of the memory controller issuing per bank refreshes, and do so without adding significant amounts of cost or taking up significant amounts of real estate for logic. In one embodiment, the memory device includes a per bank refresh counter that is applicable to multiple banks of memory. In one embodiment, the memory device increments a row address counter only when the per bank refresh counter is reset. The memory device receives a per bank refresh command from an associated memory controller, and performs a per bank refresh in response to receiving the per bank refresh command. The memory device refreshes a row identified by a row address counter for a bank identified by the per bank refresh command. The memory device increments the per bank refresh counter in response to receiving the per bank refresh command, and increments the row address counter when the per bank refresh counter is reset, either by rolling over or by a reset condition.

Reference made herein to memory devices can include different memory types. For example, memory subsystems commonly use DRAM (dynamic random access memory) which is one example of a memory device as described herein, or some variant such as synchronous DRAM (SDRAM). Thus, the memory subsystem described herein is compatible with any of a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR4 (low power dual data rate version 4, specification in development as of the filing of this application), WIO and WIO2 (Wide TO, specifications in development as of the filing of this application), and/or others, and technologies based on derivatives or extensions of such specifications.

Table 1 below illustrates one embodiment of command encoding to support directed per bank refresh for LPDDR4. Similar command encoding is available for WIO2.

TABLE 1

| | Command encoding for LPDDR4 | | | | | | | | |
|---|---|---|---|---|---|---|---|---|---|
| | SDR Command Pins | | | | | | | | |
| SDRAM | CKE | | | | SDR CA Pins (6) | | | | CK_t |
| Command | CK_t (n − 1) | CK_t (n) | CS | CA0 | CA1 | CA2 | CA3 | CA4 | CA5 | edge |
| Refresh (Per Bank, All Bank) | H | H | H L | L BA0 | L BA1 | L BA2 | H V | L V | AB DAR/RR | R1 R2 |

In one embodiment, the memory controller sends refresh commands over two clock edges, R1 and R2, with CS being asserted only on edge R1. A given refresh command instructs a memory device to either execute an all bank refresh or a per bank refresh. Per bank refreshes use the DAR/RR bit. If AB=1 on edge R1, the memory device ignores the DAR/RR bit on edge R2. If AB=0 on edge R1, the memory device uses the DAR/RR bit with the corresponding bank bits, BA0-BA2 to determine which bank to refresh. For example, the system could be configured for DAR/RR=0 to indicate using DAR, which provides directed refresh in any address order, and for DAR/RR=1 to indicate using RR, which provides a round robin approach to the bank addressing for directed refresh. It will be understood that a directed per bank refresh can specify a bank by bits BA0, BA1, and BA2, which supports 8 banks. If more banks are used, more command/address bits can be used to indicate a bank address. Current memory configurations are limited to eight banks per channel.

FIG. 1 is a block diagram of an embodiment of a system with a memory device that supports a per bank refresh. System 100 represents any type of computing system, which includes processor 110, memory controller 120, and memory device 130. Processor 110 represents any type of microcontroller, processing unit, or other processor device that executes an operating system (OS) for system 100. Processor 110 can be single or multi-core, supporting execution of a single thread or multiple threads per core. System 100 can be a standalone computing device, or part of a larger device. Processor 110 executes instructions provided by memory device 130, which in turns stores application and/or process code and data to perform the operations of system 100.

System 100 includes memory controller 120, which is a device that manages data access operations to memory device 130. Thus, when processor 110 is to access data (either a read or write) in memory device 130, memory controller 120 generates commands to execute the access operations. In one embodiment, memory controller 120 is part of processor 110. Processor 110 executes a host OS. The host OS provides a software platform on which to execute the application and/or processes that provide the functionality of system 100.

In one embodiment, memory device 130 is part of a memory subsystem that includes multiple memory devices. In one embodiment, memory device 130 is part of a standard memory DIMM (dual inline memory module). Alternatively, memory device 130 can be part of any other grouping of multiple memory devices, such as on a memory module, or can be a standalone memory device. In one embodiment, memory device 130 is a DRAM chip. Memory device 130 has storage cells or storage elements divided into multiple banks 140. Typically, each memory device in a group (e.g., a rank) of memory includes corresponding banks 140. Thus, each memory device in the group includes elements that are part of the same bank of memory.

In one embodiment, memory device 130 includes row address counter 132. In one embodiment, row address counter 132 represents a global counter to indicate which of multiple rows are to be refreshed in response to a directed per bank refresh command. Row address counter 132 is global in the sense that it is shared among all banks of a group of banks. In one embodiment, a directed per bank refresh command results in the refreshing of a single row of a specified bank 140. In one embodiment, a directed per bank refresh command results in the refreshing of a block or group of rows of the specified bank 140. For example, row address counter 132 could have a number of bits too small to individually address every row, and the bits can be interpreted as MSBs (most significant bits) of the row address, causing a refresh of every row have the same MSBs.

In one embodiment, memory device 130 includes per bank refresh counter 134. Per bank refresh counter 134 represents a counter to indicate a number of banks that have been refreshed via per bank refresh commands. In one embodiment, there could be a row address counter 132 per bank 140, in which case per bank refresh counter 134 could be unnecessary. It will be understood that having a counter per bank can have a large impact on die size or integrated circuit real estate, due to the number of memory banks per die in current and future memory chip designs. In one embodiment, per bank refresh counter 134 provides an indication of when to increment the value of row address counter 132. Other indicators of when to increment the value of row address counter 132 can be other reset conditions, such as initialization, power-up, or reset of memory device 130, after an all bank refresh, or after exiting from self-refresh. In one embodiment, the reset condition will also reset or clear the value of per bank refresh counter 134.

In one embodiment, per bank refresh counter 134 is implemented as a three-bit counter per channel on memory device 130, which allows up to eight banks per channel. Other implementations can be adjusted according to the number of banks allowed per channel. In one embodiment, per bank refresh counter 134 is shared with multiple banks, but there are multiple counters per channel. For example, 2 or 4 banks can share counters. Thus, row address counter and/or per bank refresh counter can be shared among all banks in a channel, or among a subset of banks in a channel.

In one embodiment, memory controller 120 delivers directed per bank refresh commands to memory device 130 with a round robin bank address, and the per bank refresh commands are provided in order. In one embodiment, memory controller 120 determines an order in which to provide the round robin per bank refresh commands (e.g., round robin could be implemented from highest address to lowest, from lowest address to highest, or in some order generated by memory controller 120). In one embodiment, memory controller 120 guarantees to refresh all N banks 140 prior to issuing a second per bank refresh command for any particular bank. In each cycle of refreshing banks 140, memory controller 120 can determine a new ordering for refreshing banks 140. Thus, the order can be dynamic, in any combination, each different cycle of refreshing the banks.

It will be understood that memory controller can issue a "refresh all" command before completing a cycle of refreshing all N banks 140 via per bank refresh commands. Thus, certain banks will be refreshed again. In practice, memory controller 120 can effectively "hide" some refreshing in the background with the use of directed or targeted per bank refresh commands. For example, memory controller 120 can issue a directed refresh command to a specific bank, for example, bank 140-0, and continue to issue memory access commands to banks 140-1 through 140-(N-1) while bank 140-0 is in refresh. When there is a heavy load on memory device 130, memory controller 120 can determine to perform more refreshes via per-bank directed refresh commands, and then perform an all bank refresh command when an access burst or an access load reduces. In one embodiment, two or more outstanding refreshes are allowed to each bank using per bank directed refresh commands.

Figure 2:
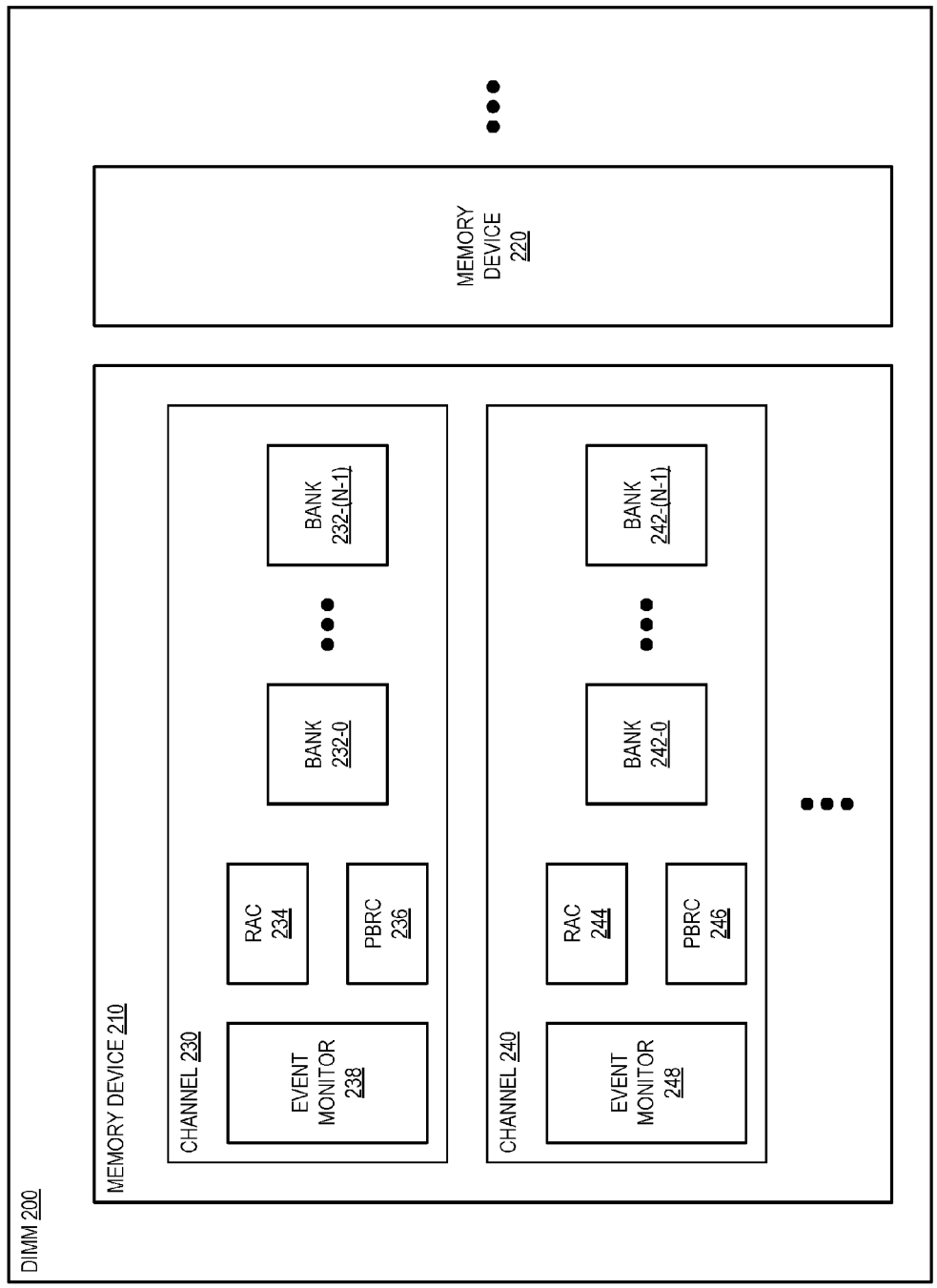
FIG. 2 is a block diagram of an embodiment of a system with a memory devices that has a global counter and a per bank refresh counter per channel.

FIG. 2 is a block diagram of an embodiment of a system with a memory devices that has a global counter and a per bank refresh counter per channel. DIMM 200 represents a memory module having multiple memory devices or DRAMs 210, 220, . . . . Each memory device can have one or multiple channels. As illustrated, memory device 210 includes multiple channels 230, 240, . . . . Each channel includes N banks. Channel 230 includes banks 232-0 through 232-(N-1), and channel 242-0 through 242-(N-1).

In one embodiment, channel 230 includes row address counter (RAC) 234, which is a row address counter shared by banks 232. When performing a directed per bank refresh command, banks 232 will refresh at the row(s) indicated by counter 234. In one embodiment, channel 230 includes per bank refresh counter (PBRC) 236, which is a counter shared by banks 232 to indicate how many of the banks have been refreshed by directed per bank refresh commands.

In one embodiment, channel 230 includes event monitor 238 or equivalent or substitute logic to monitor for reset conditions. The reset conditions include a reset of memory device 210, an all bank refresh command, or exit from self-refresh. In each reset condition, event monitor logic 238 resets or clears per bank refresh counter 236. In one embodiment, event monitoring logic 238 monitors per bank refresh counter 236 to determine when the counter reaches a threshold number. The threshold number can be based on the number, N, of banks 232. Assume that N=8, and that per bank refresh counter 236 is a three-bit counter. In such an implementation, event monitoring logic 238 can monitor the counter for roll-over (when it changes from '111' to '000'), indicating that all eight banks have been refreshed. If per bank refresh counter 236 has more than $\log_2(N)$ bits, event monitoring logic 238 can monitor for when the counter reaches N, and reset the counter. Event monitoring logic 238 can also cause row address counter 234 to be incremented when the threshold is reached.

Figure 3:
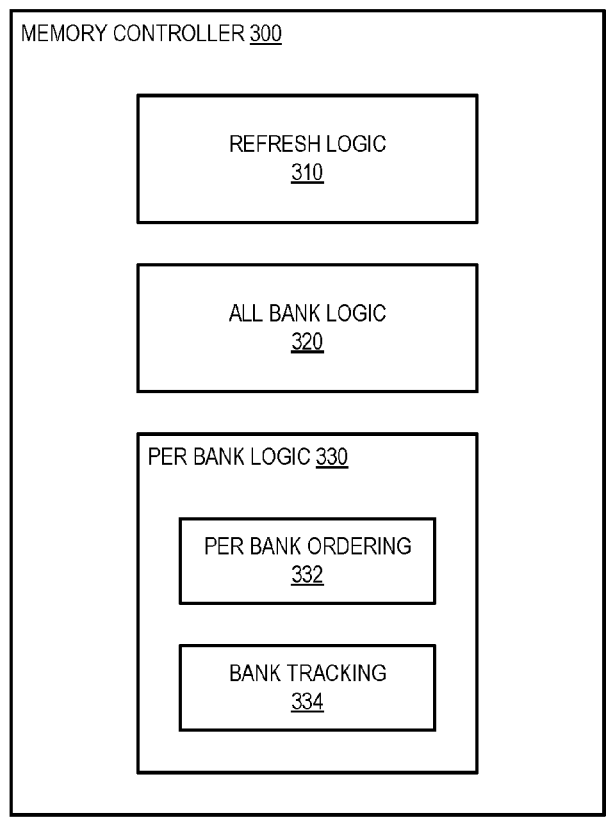
FIG. 3 is a block diagram of an embodiment of a memory controller that manages directed per bank refreshes.

FIG. 3 is a block diagram of an embodiment of a memory controller that manages directed per bank refreshes. Memory controller 300 represents a memory controller in accordance with any embodiment described. Memory controller 300 determines when to issue refresh command to an associated memory device or associated memory devices. In one embodiment, the memory controller determines to issue one or more directed per bank refresh commands, which can allow the memory controller to continue to access other banks of memory while the specified banks are being refreshed.

In one embodiment, memory controller 300 includes refresh logic 310 to determine when to issue a refresh command, and what type of refresh command to issue. The memory devices associated with a memory subsystem of which memory controller 300 is a part will have device characteristics. Part of the device characteristics includes timing parameters that indicate how often the memory device needs to be refreshed to preserve data. All bank logic 320 represents logic within memory controller 300 that determines to issue a refresh command to all banks. It will be understood that an all bank refresh command suspends data access to the memory device. Memory controller 300 can monitor access to the memory device (e.g., monitor its own generation of access commands) and issue all bank refreshes when the memory device is not busy. It is not always practical to wait until the memory device is not busy to issue an all bank refresh.

Per bank logic 330 enables memory controller 300 to issue directed per bank refresh commands. It will be understood that by issuing only per bank refresh commands, the memory controller would take more commands to perform refresh of all banks. Thus, for a practical implementation of a memory subsystem, the memory controller will perform refresh at least some of the time by issuing all bank refreshes. Per bank refresh commands allows the memory controller to delay issuing an all bank refresh command. In one embodiment, per bank logic 330 includes per bank ordering logic 332 and bank tracking logic 334. It will be understood that directed per bank refresh command can enable memory controller 300 to hide the refresh in the background, especially in an embodiment where memory controller 300 has the flexibility to randomly order the refreshes in each cycle.

Per bank ordering logic 332 enables memory controller 300 to generate an ordering for performing the per bank refreshes. In one embodiment, the ordering is based on a round robin approach. The round robin approach indicates that whatever order is used to refresh the banks with directed per bank refresh commands, memory controller 300 will continue to use the same order for refreshing the banks for all rows refreshed. In one embodiment, per bank ordering logic 332 enables memory controller 300 to generate a new order for each cycle of refreshing the memory banks. For example, consider a DRAM having eight banks, B0-B7. Memory controller 300 can issue directed per bank refresh commands to the banks in any order, such as: B1, B3, B0, B2, B5, B4, B7, B6. After the eight banks have been refreshed using directed per bank refresh commands, memory controller 300 can send another set of per bank refresh commands in a new sequence, such as: B7, B1, B0, B2, B5, B4, B3, B6. The memory controller can thus issue refresh command in bank address order, or out of bank address order. In one embodiment, memory controller 300 is constrained by a rule to send a per bank directed refresh to all banks before sending a second per bank refresh command to any bank. Per bank logic 330 can be configured to enforce the rule. Bank tracking 334 represents logic that allows the memory controller to track which banks have been refreshed using per bank refreshes, to enforce the rule. Bank tracking 334 can also indicate what banks need to be refreshed, and provide information for the memory controller to calculate whether per bank directed refresh commands can be issued, or whether an all bank refresh command should be issued.

Figure 4:
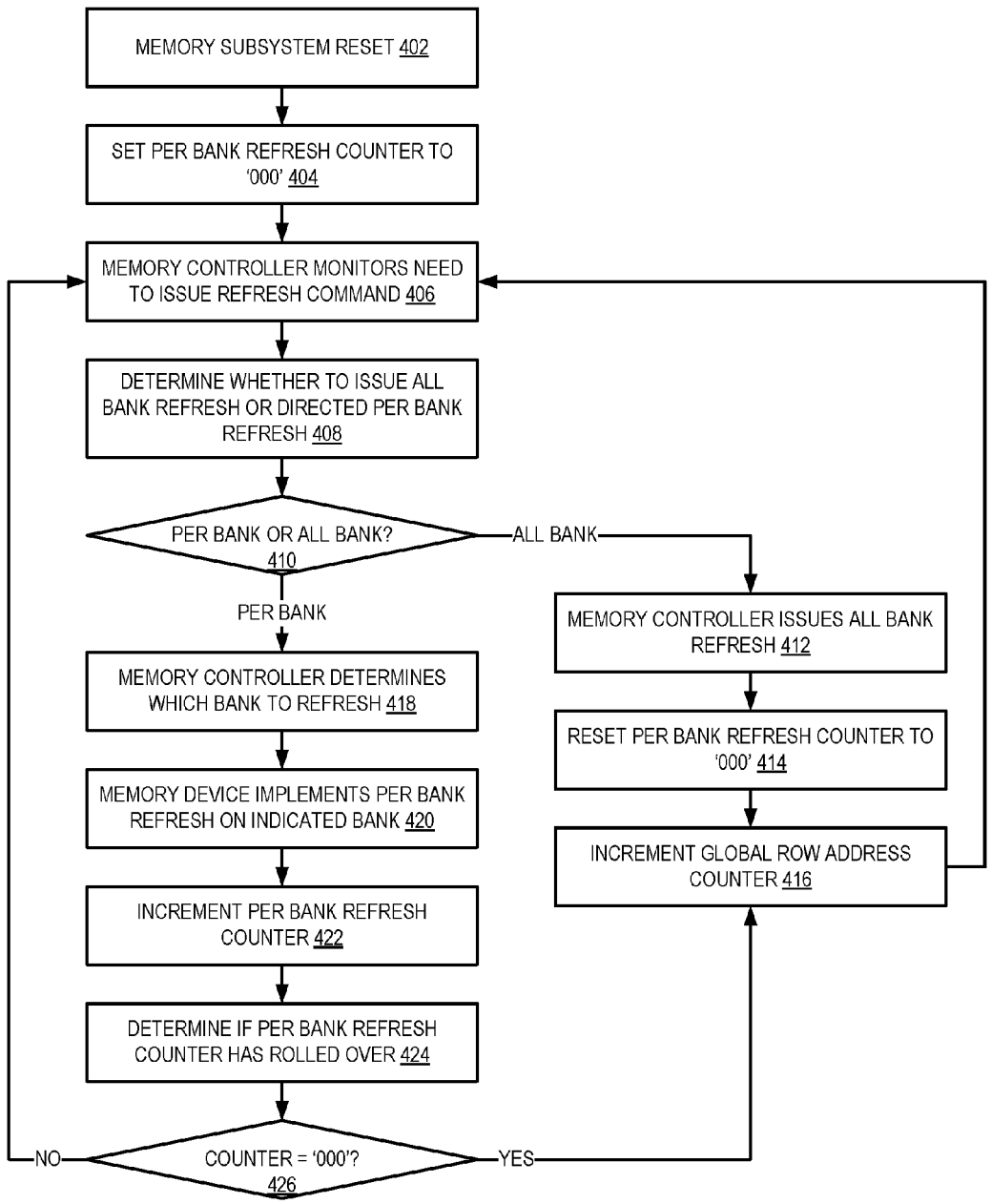
FIG. 4 is a flow diagram of an embodiment of a process for directed per bank refresh in a memory subsystem.

FIG. 4 is a flow diagram of an embodiment of a process for directed per bank refresh in a memory subsystem. In one embodiment, any of three events that result in a reset of a per bank refresh count: 1) RESET signal; 2) Self Refresh exit; and, 3) Refresh All command. A reset signal is any signal associated with resetting and initializing the memory device. A self refresh exit is associated with the memory device coming out of refresh, in which case it is refreshed already, and any bank and bank order could be used. A refresh all command refers to a command by the memory controller to refresh all banks in response to a single command.

In one embodiment, a memory subsystem is reset to an active state, 402. Assume for purposes of the figure that the memory subsystem includes eight memory devices, and a three-bit per bank refresh counter. The per bank refresh counter can be in accordance with any embodiment described. As part of bringing the memory subsystem up to an active state, the memory device sets the per bank refresh counter to '000', 404. The memory controller monitors the normal operation of the memory device to determine if the memory controller needs to issue a refresh command to the memory device, 406.

When the memory controller needs to issue a refresh command, the memory controller can determine whether to issue an all bank refresh or a per bank refresh, 408. The memory controller can make the determination based on factors such as load on the memory devices (how many access commands are being issued and are waiting to be issued to the memory devices), how long since an all bank refresh has been issued, whether other per bank refresh commands have been issued, or other factors. If the memory controller determines to issue an all bank refresh command, 410 All Bank branch, the memory controller issues an all bank refresh command, 412. In response to the command, the memory device resets the per bank refresh counter to '000', 414. The memory device then increments the global row address counter, 416. Thus, the next refresh will occur at a different row address than what was previously indicated by the counter, because an all bank refresh will have refreshed all banks at that address. Thus, the row address counter applies to the group of banks to which the per bank refresh counter applies. After incrementing the row address counter, the system goes back to normal operation, with the memory controller monitoring for the need to issue a refresh command, 406. Subsequent refresh commands will refresh at the incremented row address.

If the memory controller determines to issue a per bank refresh command, 410 Per Bank branch, the memory controller determines which bank to refresh, 418. The memory controller will issue a per bank refresh command in accordance with an ordering determined for the banks. The memory controller ordering the banks for directed refresh is discussed above (see especially FIG. 3). The memory device receives the per bank refresh command from the memory controller and implements the directed refresh on the specified bank, 420. The memory device increments the per bank refresh counter, 422.

The memory device can determine if the per bank refresh counter has rolled over due to incrementing the counter, 424. In one embodiment, the memory device can simply test the per bank refresh counter for a threshold number instead of determining if the counter has rolled over. In such an embodiment, the memory device could reset the counter if the threshold is reached. In the illustrated embodiment, the counter will roll over, at which point the per bank refresh counter will have a value of '000'. Thus, if the counter='000', 426 Yes branch, the memory device will increment the global row address counter, 416, and return to normal operation, 406. If the counter≠'000', 426 No branch, the memory device simply returns to normal operation. It will be understood that if the counter has rolled over, the row address counter is incremented because all banks have been refreshed at the address indicated. If the counter has not rolled over, subsequent directed per bank refresh commands will refresh different specified banks at the same row address, until all banks have been refreshed.

Figure 5:
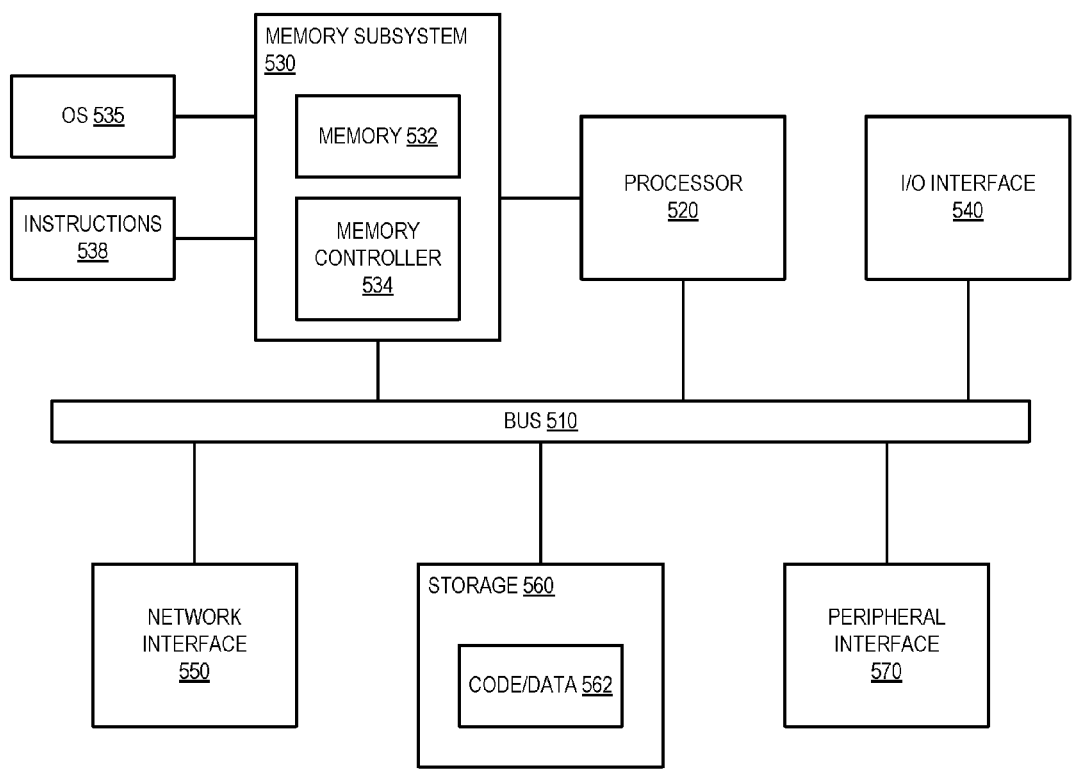
FIG. 5 is a block diagram of an embodiment of a computing system in which per bank refresh can be implemented.

FIG. 5 is a block diagram of an embodiment of a computing system in which per bank refresh can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

System 500 includes one or more multiple memory devices 532 associated with memory controller 534, and each memory device 532 includes multiple banks of memory. In one embodiment, memory device 532 includes a per bank refresh counter applicable to multiple banks of memory, as well as a row address counter applicable to the multiple banks. The per bank refresh counter can be used to determine when all of the multiple banks have been refreshed by per bank refresh command, after which the row address counter can be incremented. The per bank refresh counter can be reset at other reset conditions.

Figure 6:
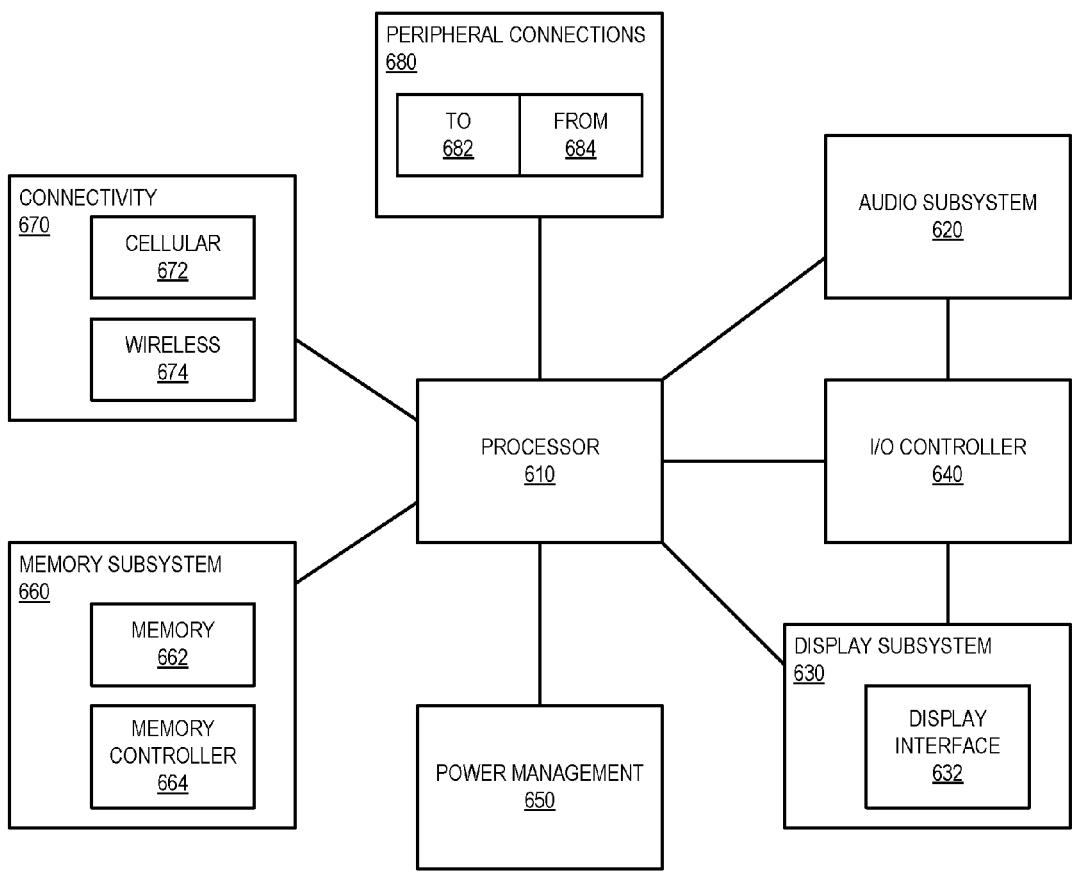
FIG. 6 is a block diagram of an embodiment of a mobile device in which per bank refresh can be implemented.

FIG. 6 is a block diagram of an embodiment of a mobile device in which per bank refresh can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

System 600 includes one or more multiple memory devices 662 associated with memory controller 664, and each memory device 662 includes multiple banks of memory. In one embodiment, memory device 662 includes a per bank refresh counter applicable to multiple banks of memory, as well as a row address counter applicable to the multiple banks. The per bank refresh counter can be used to determine when all of the multiple banks have been refreshed by per bank refresh command, after which the row address counter can be incremented. The per bank refresh counter can be reset at other reset conditions.

In one aspect, a method for performing per bank refresh includes receiving a per bank refresh command at a memory device from a memory controller; performing a per bank refresh in response to receiving the per bank refresh command for a bank identified by the command at a row identified by a row address counter; incrementing a per bank refresh counter in response to receiving the per bank refresh command; determining if incrementing the per bank refresh counter causes the per bank refresh counter to roll over; and when the per bank refresh counter rolls over, incrementing the row address counter; otherwise, maintaining the row address counter at a current value for a subsequent per bank refresh command.

In one embodiment, receiving the per bank refresh command comprises receiving a command to refresh a bank out of bank address order. In one embodiment, receiving the command out of bank address order comprises receiving the command to refresh the banks in a random order. In one embodiment, performing the per bank refresh comprises refreshing all banks via per bank refresh command prior to repeating a per bank refresh of any of the banks. In one embodiment, incrementing the per bank refresh counter comprises incrementing a counter applicable to all banks in a channel. In one embodiment, incrementing the per bank refresh counter comprises incrementing a counter applicable to multiple banks, for a subset of banks in a channel. In one embodiment, the method further comprising clearing the per bank refresh counter in response to detecting a reset condition. In one embodiment, the reset condition comprises a memory subsystem reset signal generated in response to a power-up condition. In one embodiment, the reset condition comprises exit of the memory device from self-refresh. In one embodiment, the reset condition comprises receiving an all bank refresh command from the memory controller.

In one aspect, a memory device that performs per bank refresh includes multiple banks of memory, each having multiple rows; connectors to couple to a memory controller and receive a per bank refresh command from the memory controller, the per bank refresh command identifying a specific one of the multiple bank to refresh; a row address counter to indicate a row address to refresh for the specific bank identified by the per bank refresh command; a per bank refresh counter to increment in response to receiving the per bank refresh command; and logic to determine if incrementing the per bank refresh counter causes the per bank refresh counter to roll over, and when the per bank refresh counter rolls over, to increment the row address counter; otherwise, to maintain the row address counter at a current value for a subsequent per bank refresh command.

In one embodiment, receive the per bank refresh command comprises receiving a command to refresh a bank out of bank address order. In one embodiment, receiving the command out of bank address order comprises receiving the command to refresh the banks in a random order. In one embodiment, performing the per bank refresh comprises refreshing all banks via per bank refresh command prior to repeating a per bank refresh of any of the banks. In one embodiment, incrementing the per bank refresh counter comprises incrementing a counter applicable to all banks in a channel. In one embodiment, the memory device includes multiple memory access channels, and wherein the per bank refresh counter is applicable to all banks in a channel, but not to banks of other channels. In one embodiment, the banks of memory are grouped as separate subsets, and wherein the per bank refresh counter is applicable to all banks in a subset, but not to banks of other subsets. In one embodiment, the logic to further clear the per bank refresh counter in response to detecting a reset condition. In one embodiment, the reset condition comprises one of a memory subsystem reset signal generated in response to a power-up condition, exit of the memory device from self-refresh, or receiving an all bank refresh command from the memory controller.

In one aspect, a memory subsystem that performs per bank refresh includes connectors to couple to a memory device having multiple rows of memory; a memory controller device coupled to the connectors, the memory controller to determine to issue a per bank refresh to refresh a specific one of multiple memory banks instead of an all bank refresh; determine a per bank ordering pattern for the multiple memory banks; transmit a per bank refresh command to the memory device to cause the memory device to perform a per bank refresh for a bank identified by the refresh command at a row identified by a row address counter, wherein the memory device increments a per bank refresh counter in response to the refresh command, and increments a row address counter only in response to a per bank refresh counter reset condition, and otherwise, maintains the row address counter at a current value for a subsequent per bank refresh command.

In one embodiment, the order pattern comprises an order out of bank address order. In one embodiment, the out of bank address order pattern comprises a random order. In one embodiment, the out of bank address order pattern comprises a different order for each cycle of per bank refresh commands. In one embodiment, the memory controller to determine to issue the per bank refresh further comprises the memory controller to refresh all banks via per bank refresh command prior to repeating a per bank refresh of any of the banks. In one embodiment, the reset condition comprises one of a rolling over of the per bank refresh counter, a memory subsystem reset signal generated in response to a power-up condition, exit of the memory device from self-refresh, or receiving an all bank refresh command from the memory controller.

In one aspect, an electronic device with a memory subsystem that performs per bank refresh, includes a hardware platform including a processor; a memory device on the hardware platform to receive communication from a memory controller device on the hardware platform, the memory device including multiple banks of memory, each having multiple rows; connectors to couple to a memory controller and receive a per bank refresh command from the memory controller, the per bank refresh command identifying a specific one of the multiple bank to refresh; a row address counter to indicate a row address to refresh for the specific bank identified by the per bank refresh command; a per bank refresh counter to increment in response to receiving the per bank refresh command; and logic to determine if incrementing the per bank refresh counter causes the per bank refresh counter to roll over, and when the per bank refresh counter rolls over, to increment the row address counter; otherwise, to maintain the row address counter at a current value for a subsequent per bank refresh command; and a touchscreen display coupled to generate a display based on data accessed from the memory device.

In one embodiment, receive the per bank refresh command comprises receiving a command to refresh a bank out of bank address order. In one embodiment, receiving the command out of bank address order comprises receiving the command to refresh the banks in a random order. In one embodiment, performing the per bank refresh comprises refreshing all banks via per bank refresh command prior to repeating a per bank refresh of any of the banks. In one embodiment, incrementing the per bank refresh counter comprises incrementing a counter applicable to all banks in a channel. In one embodiment, the memory device includes multiple memory access channels, and wherein the per bank refresh counter is applicable to all banks in a channel, but not to banks of other channels. In one embodiment, the banks of memory are grouped as separate subsets, and wherein the per bank refresh counter is applicable to all banks in a subset, but not to banks of other subsets. In one embodiment, the logic to further clear the per bank refresh counter in response to detecting a reset condition. In one embodiment, the reset condition comprises one of a memory subsystem reset signal generated in response to a power-up condition, exit of the memory device from self-refresh, or receiving an all bank refresh command from the memory controller.

In one aspect, an apparatus for performing per bank refresh includes means for receiving a per bank refresh command at a memory device from a memory controller; means for performing a per bank refresh in response to receiving the per bank refresh command for a bank identified by the command at a row identified by a row address counter; means for incrementing a per bank refresh counter in response to receiving the per bank refresh command; means for determining if incrementing the per bank refresh counter causes the per bank refresh counter to roll over; and means for incrementing the row address counter when the per bank refresh counter rolls over, or otherwise, maintaining the row address counter at a current value for a subsequent per bank refresh command.

In one embodiment, the means for receiving the per bank refresh command comprises means for receiving a command to refresh a bank out of bank address order. In one embodiment, the means for receiving the command out of bank address order comprises means for receiving the command to refresh the banks in a random order. In one embodiment, the means for performing the per bank refresh comprises means for refreshing all banks via per bank refresh command prior to repeating a per bank refresh of any of the banks. In one embodiment, the means for incrementing the per bank refresh counter comprises means for incrementing a counter applicable to all banks in a channel. In one embodiment, the means for incrementing the per bank refresh counter comprises means for incrementing a counter applicable to multiple banks, for a subset of banks in a channel. In one embodiment, the apparatus further comprising means for clearing the per bank refresh counter in response to detecting a reset condition. In one embodiment, the reset condition comprises one of a memory subsystem reset signal generated in response to a power-up condition, exit of the memory device from self-refresh, or receiving an all bank refresh command from the memory controller.

In one aspect, an article of manufacture comprising a computer readable storage medium having content stored thereon, which when executed by a computing device performs operation including receiving a per bank refresh command at a memory device from a memory controller; performing a per bank refresh in response to receiving the per bank refresh command for a bank identified by the command at a row identified by a row address counter; incrementing a per bank refresh counter in response to receiving the per bank refresh command; determining if incrementing the per bank refresh counter causes the per bank refresh counter to roll over; and incrementing the row address counter when the per bank refresh counter rolls over, or otherwise, maintaining the row address counter at a current value for a subsequent per bank refresh command.

In one embodiment, the content for receiving the per bank refresh command comprises content for receiving a command to refresh a bank out of bank address order. In one embodiment, the content for receiving the command out of bank address order comprises content for receiving the command to refresh the banks in a random order. In one embodiment, the content for performing the per bank refresh comprises content for refreshing all banks via per bank refresh command prior to repeating a per bank refresh of any of the banks. In one embodiment, the content for incrementing the per bank refresh counter comprises content for incrementing a counter applicable to all banks in a channel. In one embodiment, the content for incrementing the per bank refresh counter comprises content for incrementing a counter applicable to multiple banks, for a subset of banks in a channel. In one embodiment, the article of manufacture further comprising content for clearing the per bank refresh counter in response to detecting a reset condition. In one embodiment, the reset condition comprises one of a memory subsystem reset signal generated in response to a power-up condition, exit of the memory device from self-refresh, or receiving an all bank refresh command from the memory controller.

In one aspect, a method in a memory subsystem for sending a per bank refresh command, includes determining to issue a per bank refresh to refresh a specific one of multiple memory banks instead of an all bank refresh; determining a per bank ordering pattern for the multiple memory banks; and transmitting a per bank refresh command to the memory device to cause the memory device to perform a per bank refresh for a bank identified by the refresh command at a row identified by a row address counter, wherein the memory device increments a per bank refresh counter in response to the refresh command, and increments a row address counter only in response to a per bank refresh counter reset condition, and otherwise, maintains the row address counter at a current value for a subsequent per bank refresh command.

In one embodiment, the order pattern comprises an order out of bank address order. In one embodiment, the out of bank address order pattern comprises a random order. In one embodiment, the out of bank address order pattern comprises a different order for each cycle of per bank refresh commands. In one embodiment, determining to issue the per bank refresh further comprises refreshing all banks via per bank refresh command prior to repeating a per bank refresh of any of the banks. In one embodiment, the reset condition comprises one of a rolling over of the per bank refresh counter, a memory subsystem reset signal generated in response to a power-up condition, exit of the memory device from self-refresh, or receiving an all bank refresh command from the memory controller.

In one aspect, an apparatus for sending per bank refresh commands includes means for determining to issue a per bank refresh to refresh a specific one of multiple memory banks instead of an all bank refresh; means for determining a per bank ordering pattern for the multiple memory banks; and means for transmitting a per bank refresh command to the memory device to cause the memory device to perform a per bank refresh for a bank identified by the refresh command at a row identified by a row address counter, wherein the memory device increments a per bank refresh counter in response to the refresh command, and increments a row address counter only in response to a per bank refresh counter reset condition, and otherwise, maintains the row address counter at a current value for a subsequent per bank refresh command.

In one embodiment, the order pattern comprises an order out of bank address order. In one embodiment, the out of bank address order pattern comprises a random order. In one embodiment, the out of bank address order pattern comprises a different order for each cycle of per bank refresh commands. In one embodiment, the means for determining to issue the per bank refresh further comprises means for refreshing all banks via per bank refresh command prior to repeating a per bank refresh of any of the banks. In one embodiment, the reset condition comprises one of a rolling over of the per bank refresh counter, a memory subsystem reset signal generated in response to a power-up condition, exit of the memory device from self-refresh, or receiving an all bank refresh command from the memory controller.

In one aspect, an article of manufacture comprising a computer readable storage medium having content stored thereon, which when executed by a computing device performs operation including determining to issue a per bank refresh to refresh a specific one of multiple memory banks instead of an all bank refresh; determining a per bank ordering pattern for the multiple memory banks; and transmitting a per bank refresh command to the memory device to cause the memory device to perform a per bank refresh for a bank identified by the refresh command at a row identified by a row address counter, wherein the memory device increments a per bank refresh counter in response to the refresh command, and increments a row address counter only in response to a per bank refresh counter reset condition, and otherwise, maintains the row address counter at a current value for a subsequent per bank refresh command.

In one embodiment, the order pattern comprises an order out of bank address order. In one embodiment, the out of bank address order pattern comprises a random order. In one embodiment, the out of bank address order pattern comprises a different order for each cycle of per bank refresh commands. In one embodiment, the content for determining to issue the per bank refresh further comprises content for refreshing all banks via per bank refresh command prior to repeating a per bank refresh of any of the banks. In one embodiment, the reset condition comprises one of a rolling over of the per bank refresh counter, a memory subsystem reset signal generated in response to a power-up condition, exit of the memory device from self-refresh, or receiving an all bank refresh command from the memory controller.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
a memory controller to send a plurality of refresh commands to a plurality of memory banks according to a per bank refresh order, where, each of the banks are identified in the order so that each bank is refreshed before any of the banks is refreshed again, the memory controller comprising an interface to couple to a memory channel, the interface comprising CA signal lines, the CA signal lines to respectively transmit BA0, BA1 and BA2 bank address signals, a particular one of the memory banks for each of the refresh commands to be identified by the BA0, BA1 and BA2 signals on the CA signal lines.

2. The apparatus of claim 1 wherein the memory controller is also to send an all bank refresh to the plurality of memory banks.

3. The apparatus of claim 1 wherein the memory controller includes a bank counter.

4. The apparatus of claim 1 wherein the plurality of memory banks is eight memory banks.

5. The apparatus of claim 1 wherein the per bank refresh order is reset by any of:
a RESET signal;
a self refresh exit;
an all bank refresh.

6. The apparatus of claim 1 further comprising the plurality of memory banks being coupled to the memory controller.

7. The apparatus of claim 1 wherein the memory controller is further coupled to at least one processing core.

8. The apparatus of claim 7 wherein the memory controller and at least one processing core are implemented in a computer.

9. The apparatus of claim 1 wherein the memory controller is further coupled to a networking interface.

10. The apparatus of claim 1 wherein the memory controller is a component of a computing system comprising at least one of:
a networking interface;
a display.

11. A method, comprising:
sending a plurality of refresh commands to a plurality of memory banks according to a per bank refresh order, where, each of the banks are identified in the order so that each bank is refreshed before any of the banks is refreshed again, the sending of the plurality of refresh commands comprising identifying a particular one of the memory banks for each of the refresh commands with BA0, BA1 and BA2 signals sent over CA signal lines of a DDR memory channel.

12. The method of claim 11 further comprising sending an all bank refresh to the plurality of memory banks.

13. The method of claim 11 wherein the plurality of memory banks is eight memory banks.

14. The method of claim 11 wherein the per bank refresh order is reset by any of:
a RESET signal;
a self refresh exit;
an all bank refresh.

* * * * *